(12) United States Patent
Atsumi et al.

(10) Patent No.: US 10,917,960 B2
(45) Date of Patent: Feb. 9, 2021

(54) DEPOSITION APPARATUS

(71) Applicant: CANON ANELVA CORPORATION, Kawasaki (JP)

(72) Inventors: Masahiro Atsumi, Fuchu (JP); Hidekazu Nishimura, Hachioji (JP); Masahiro Shibamoto, Hachioji (JP); Hiroshi Yakushiji, Tokyo (JP)

(73) Assignee: CANON ANELVA CORPORATION, Kawasaki (JP)

( * ) Notice: Subject to any disclaimer, the term of this patent is extended or adjusted under 35 U.S.C. 154(b) by 378 days.

(21) Appl. No.: 15/395,200

(22) Filed: Dec. 30, 2016

(65) Prior Publication Data
US 2017/0202077 A1 Jul. 13, 2017

(30) Foreign Application Priority Data
Jan. 7, 2016 (JP) .................. 2016-001947

(51) Int. Cl.
| | | |
|---|---|---|
| H01J 37/32 | (2006.01) | |
| H05H 1/10 | (2006.01) | |
| C23C 14/06 | (2006.01) | |
| C23C 14/32 | (2006.01) | |
| C23C 14/56 | (2006.01) | |

(Continued)

(52) U.S. Cl.
CPC .......... *H05H 1/10* (2013.01); *C23C 14/0605* (2013.01); *C23C 14/325* (2013.01); *C23C 14/564* (2013.01); *C23C 16/458* (2013.01); *C23C 16/50* (2013.01); *H01J 37/32055* (2013.01); *H05H 1/48* (2013.01)

(58) Field of Classification Search
CPC . C23C 14/0605; C23C 14/325; C23C 14/564; C23C 16/458; C23C 16/50; H01J 37/32055; H05H 1/10; H05H 1/48

USPC ....................... 204/192.38, 298.41
See application file for complete search history.

(56) References Cited

U.S. PATENT DOCUMENTS 4,511,593 A * 4/1985 Brandolf ................. C23C 14/32
118/50.1
5,895,559 A * 4/1999 Christy ................. C23C 14/325
204/192.38

(Continued)

FOREIGN PATENT DOCUMENTS

JP H11-246964 A 9/1999
JP 2002-025794 A 1/2002

(Continued)

OTHER PUBLICATIONS

Office Action (Grounds for Rejection) dated Dec. 22, 2016, by the Japanese Patent Office in corresponding Japanese Patent Application No. 2016-001947 and English Translation of the Office Action. (7 pages).

*Primary Examiner* — Rodney G McDonald
(74) *Attorney, Agent, or Firm* — Buchanan Ingersoll & Rooney PC

(57) ABSTRACT

A deposition apparatus includes a plasma generator for generating a plasma by arc discharge, and a deposition unit for forming a film on a member by the plasma generated by the plasma generator. The plasma generator includes a target holder for holding a target and applying a negative potential to the target, an anode to which a positive potential is applied, and a capture for capturing droplets from the target. The anode has an opening, and the capture is arranged in the opening.

17 Claims, 5 Drawing Sheets

(51) Int. Cl.
　　　*C23C 16/458*　　(2006.01)
　　　*C23C 16/50*　　 (2006.01)
　　　*H05H 1/48*　　　(2006.01)

(56) References Cited

U.S. PATENT DOCUMENTS

| | | | | |
|---|---|---|---|---|
| 5,902,462 | A * | 5/1999 | Krauss | C23C 14/325 |
| | | | | 204/192.38 |
| 6,638,403 | B1 * | 10/2003 | Inaba | C23C 14/325 |
| | | | | 118/723 HC |
| 6,692,624 | B2 * | 2/2004 | Kolpakov | C23C 14/325 |
| | | | | 118/723 VE |
| 6,875,326 | B2 | 4/2005 | Inaba et al. | |
| 7,976,612 | B2 | 7/2011 | Shiina | |
| 2008/0105657 | A1 | 5/2008 | Wu et al. | |
| 2010/0059369 | A1 * | 3/2010 | Shiina | H01J 37/147 |
| | | | | 204/298.41 |
| 2012/0037504 | A1 * | 2/2012 | Shiina | C23C 14/0605 |
| | | | | 204/298.41 |

FOREIGN PATENT DOCUMENTS

| | | |
|---|---|---|
| JP | 2004-060019 A | 2/2004 |
| JP | 2005-002454 A | 1/2005 |
| JP | 2007-254770 A | 10/2007 |
| JP | 2010-202899 A | 9/2010 |
| JP | 4889957 B2 | 3/2012 |

* cited by examiner

DEPOSITION APPARATUS

BACKGROUND OF THE INVENTION

Field of the Invention

The present invention relates to a deposition apparatus.

Description of the Related Art

A PCVD (Plasma-enhanced Chemical Vapor Deposition) method using a reactive gas such as acetylene ($C_2H_2$) or ethylene ($C_2H_4$) is available as a method of forming a protective film on a medium such as a hard disk. Recently, in order to improve the drive characteristics by decreasing the spacing distance and head floating amount between a magnetic read head and a magnetic recording layer of a medium, demands have arisen for further thinning a protective film such as a carbon protective film to be formed on the magnetic recording layer.

On the other hand, the limit of the thickness of a carbon protective film formed by the PCVD method is said to be 2 to 3 nm due to the characteristics of the film. Instead of the PCVD method, therefore, a vacuum arc deposition method using arc discharge is attracting attention as a technique capable of forming a thinner carbon protective film. Compared to the PCVD method, the vacuum arc deposition method can form a hard carbon protective film having a small hydrogen content, so the film thickness may be decreased to about 1 nm.

Japanese Patent Laid-Open No. 2010-202899 describes a plasma processing apparatus including a plasma generator which forms a plasma stream by generating a plasma by vacuum arc discharge, a plasma guide unit which guides the plasma stream along a bent plasma traveling path, and a droplet capturing unit. The droplet capturing unit is arranged in front of the cathode of the plasma generator, and captures droplets separated from the plasma stream traveling in the plasma traveling.

Japanese Patent No. 4889957 describes a plasma processing apparatus including an ark discharge unit, a main traveling path in which a plasma generated together with droplets travels, a droplet removing device, and a plasma processor. The droplet removing device is arranged between the main traveling path and the plasma processor. The droplet removing device includes a plurality of apertures having eccentric passing holes. The plasma passes through the eccentric passing holes while curving, and the droplets are removed from the plasma by colliding against the wall surfaces of the apertures.

In the apparatuses described in Japanese Patent Laid-Open No. 2010-202899 and Japanese Patent No. 4889957, the droplet capturing unit is arranged in a position very far from a plasma source for generating a plasma, so a large amount of droplets may adhere to members arranged in the path between the plasma source and the capturing unit over a broad range. Accordingly, a work of removing the droplets must be performed over the broad range. This increases the maintenance cost, and may decrease the productivity.

SUMMARY OF THE INVENTION

The present invention provides a deposition apparatus advantageous in viewpoints of the maintenance cost and productivity.

The present invention relates to a deposition apparatus including a plasma generator configured to generate a plasma by arc discharge, and a deposition unit configured to form a film on a member by the plasma generated by the plasma generator, wherein the plasma generator includes a target holder configured to hold a target and apply a negative potential to the target, an anode to which a positive potential is applied, and a capture configured to capture droplets from the target, the anode has an opening, and the capture is arranged in the opening.

Further features of the present invention will become apparent from the following description of exemplary embodiments (with reference to the attached drawings).

DESCRIPTION OF THE EMBODIMENTS

The present invention will be explained below by way of its exemplary embodiments with reference to the accompanying drawings.

Figure 1:
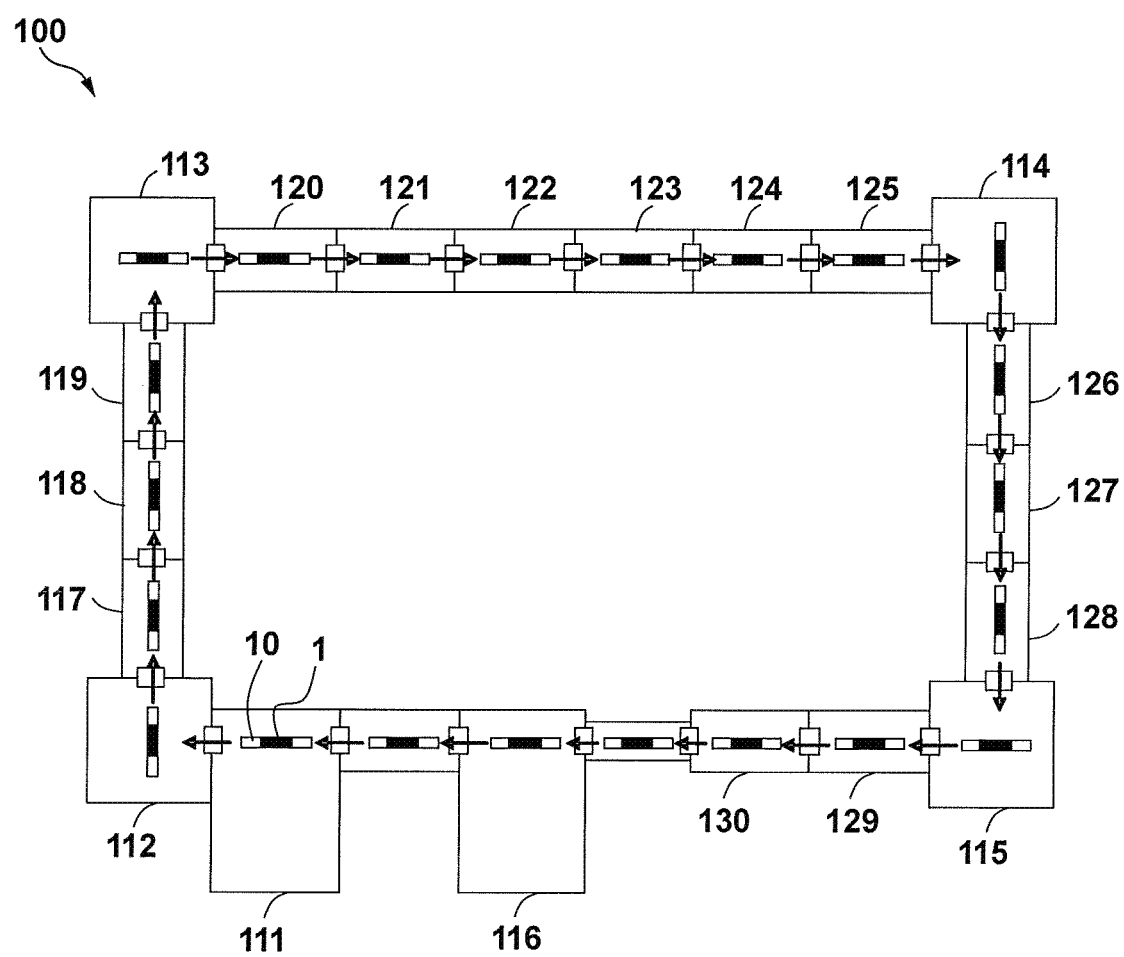
FIG. 1 is a view showing the configuration of a processing system of an embodiment of the present invention.

FIG. 1 shows the arrangement of a processing system 100 of an embodiment of the present invention. The processing system 100 can be used to stack a plurality of films on a member 1 such as a substrate as a material for manufacturing a medium such as a hard disk. In this embodiment, the processing system 100 is an in-line type system which processes the members 1 while transferring the members 1 through a plurality of connected processing apparatuses 117 to 130. Each of the plurality of processing apparatuses 117 to 130 has a chamber including an exhaust device, and adjacent chambers are connected via a gate valve. The member 1 can be transferred as it is mounted on a carrier 10. The member 1 can be, for example, a disk-like member made of a metal or glass and having a hole (inner circumferential hole) in a central portion. For example, the processing system 100 can be so configured as to form a magnetic layer and a protective film for protecting the magnetic layer on the two opposite surfaces of the member 1.

A processing apparatus 111 includes, for example, a load lock chamber, and can perform a process of attaching the member 1 to the carrier 10 in the load lock chamber. A processing apparatus 116 includes, for example, an unload lock chamber, and can perform a process of detaching the member 1 from the carrier 10 in the unload lock chamber. Processing apparatuses 112, 113, 114, and 115 can perform a direction changing process of changing the transfer direction of the carrier 10 holding the member 1 through 90°.

The processing apparatus 117 can perform, for example, a process of forming an adhesive layer on the member 1. The processing apparatuses 118, 119, and 120 can perform a process of forming a soft magnetic layer on the member 1 on which the adhesive layer is formed. The processing apparatus 121 can perform a process of forming a seed layer on the member 1 on which the soft magnetic layer is formed. The processing apparatuses 123 and 124 can perform a process of forming an interlayer on the member 1 on which the seed layer is formed. The processing apparatuses 126 and 127 can perform a process of forming a magnetic film on the member 1 on which the interlayer is formed. The processing apparatus 129 can perform a process of forming a protective film on the member 1 on which the magnetic film is formed.

The procedures of processing a plurality of members 1 in the processing system 100 will exemplarily be explained. First, the processing apparatus 111 attaches the member 1 to a first carrier 10, the processing apparatus 112 changes the direction and transfers the first carrier 10 to the processing apparatus 117, and the processing apparatus 117 forms an adhesive layer. Meanwhile, the processing apparatus 111 attaches the next member 1 to a second carrier 10.

Then, a soft magnetic layer is formed on the member 1 while the first carrier 10 is transferred in the order of the processing apparatuses 118, 119, and 120 for forming a soft magnetic layer. In the meanwhile, the second carrier 10 moves to the processing apparatus 117 for forming an adhesive layer, and an adhesive layer is formed on the member 11. In addition, the processing apparatus 111 attaches the member 1 to a third carrier 10. Thus, whenever the first carrier 10 and the following carriers 10 move, the processing apparatus 111 attaches the member 1 to a succeeding carrier 10.

Subsequently, the first carrier 10 holding the member 1 on which the soft magnetic layer is formed is transferred to the processing apparatus 121 for forming a seed layer, and a seed layer is formed on the member 1. After that, the first carrier 10 moves in the order of the processing apparatuses 123 and 124 for forming an interlayer, the processing apparatuses 126 and 127 for forming a magnetic film, and the processing apparatus 129 for forming a protective film, and an interlayer, magnetic film, and protective film are formed in this order on the substrate 1.

Figure 2:
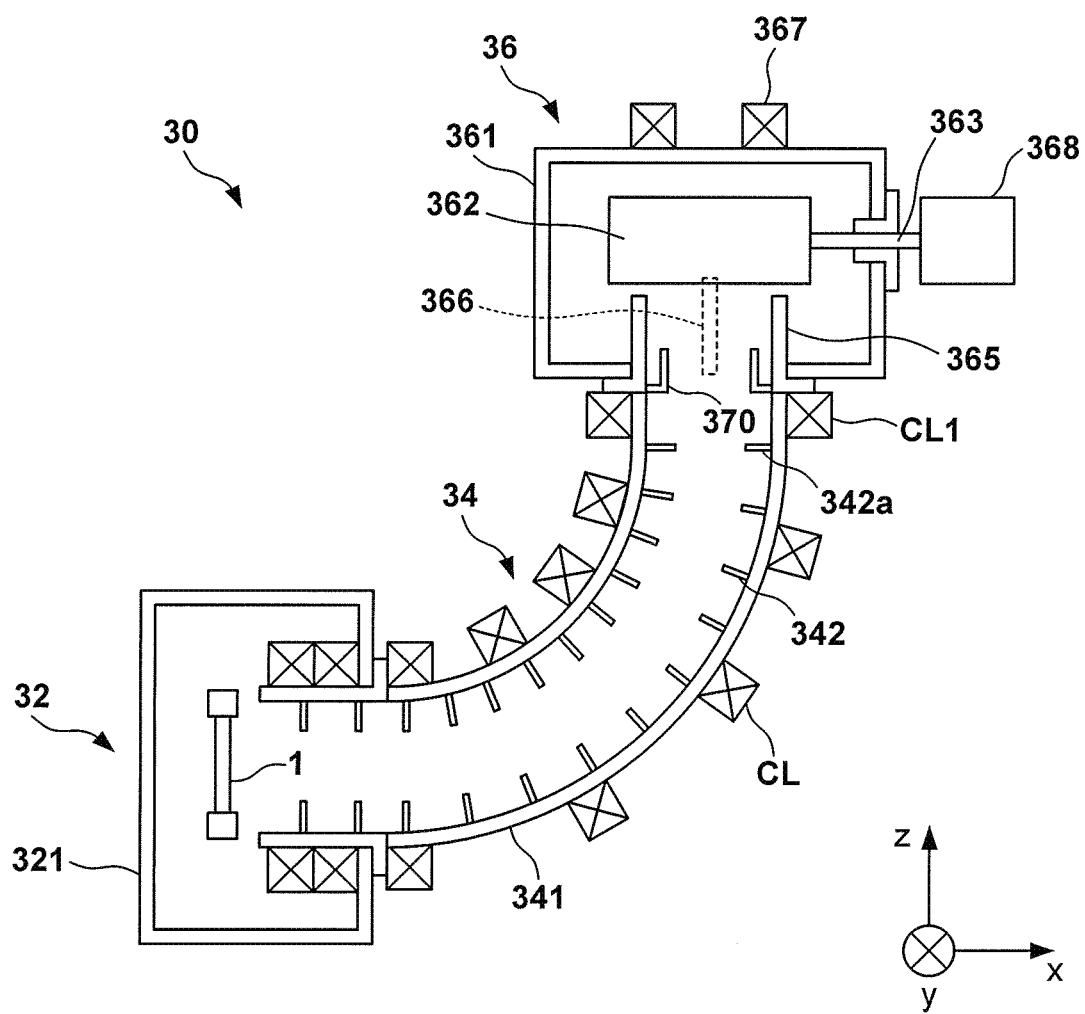
FIG. 2 is a view schematically showing the arrangement of a deposition apparatus which can be incorporated into the processing system.

FIG. 2 schematically shows the arrangement of a deposition apparatus 30 which can be incorporated into the processing system 100. For example, the deposition apparatus 30 can be incorporated as the processing apparatus 129 into the processing system 100. The deposition apparatus 30 can be used as a ta-C (tetrahedral-amorphous carbon) deposition apparatus which forms a protective film made of a ta-C layer on the surface of the magnetic film formed on the member 1, but can also be used to form another film.

The deposition apparatus 30 can include a module including a deposition unit 32, a guide 34, and a plasma generator (source unit) 36. The deposition apparatus 30 can include a plurality of modules. For example, the deposition apparatus 30 can include two modules so as to form films on the two surfaces of the member 1.

In the deposition unit 32, a plasma generated by the plasma generator 36 forms a film on the member 1. The deposition unit 32 has a process chamber (deposition chamber) 321, and the process chamber 321 can include a transfer mechanism for transferring and positioning the member 1 in a posture by which a surface to be processed is set along the vertical direction. The process chamber 321 can also include an exhaust device for evacuating the interior of the process chamber 321.

The guide 34 can be so arranged as to guide the plasma from the plasma generator 36 to the deposition unit 32. One end of the guide 34 can be connected to the deposition unit 32, and the other end thereof can be connected to the plasma generator 36. The deposition unit 32 can be arranged in a position lower than the plasma generator 36. The XYZ coordinate axes shown in FIG. 2 are defined such that the Z-axis is the vertical direction. The guide 34 has a bent duct (tubular member) 341. One end of the duct 341 can be connected to the process chamber 321 of the deposition unit 32, and the other end thereof can be connected to a discharge chamber 361 of the plasma generator 36. The other end of the duct 341 can be arranged below the discharge chamber 361. That is, the other end of the duct 34 can be arranged below the discharge chamber 361 in the vertical direction (the direction of gravity).

The guide 34 can include a plurality of coils CL for generating a magnetic field for guiding the plasma. The plurality of coils CL can be arranged outside the duct 34. The guide 34 can also include a plurality of baffles 342 arranged inside the duct 34 so as to capture droplets. Each baffle 342 has an opening (for example, a circular opening) through which the plasma passes. Each baffle 342 can be made of, for example, a metal. The baffle 342 closest to the plasma generator 36 among the plurality of baffles 342 will be called a first baffle 342a for the sake of convenience for the following explanation. In addition, the plurality of coils CL can include a coil arranged in a portion of the duct 341 between a capture 370 and the first baffle 342a, and this coil will be called a first coil CL1 for the sake of convenience for the following explanation.

The guide 34 is not an essential constituent element, and the deposition unit 32 can be arranged below the plasma generator 36 if the guide 34 is not installed. In this case, an opening for allowing the internal space of the process chamber 321 of the deposition unit 32 to communicate with the internal space of the discharge chamber 361 of the plasma generator 36 can be formed above the process chamber 321. In addition, the member 1 can be so arranged that the normal of its non-deposition surface points upward.

Droplets are particles larger than plasma particles (particles such as ions, atoms, and molecules forming a plasma) from a target 362 of the plasma generator 36, and normally having a nanometer-order size to a few hundred micrometer-order size (0.01 to 1,000 μm). Since the droplets are different in mass and charge amount from the plasma particles, the droplets can come off the guiding path of the guide 34 and can be captured by the baffles 342. In this embodiment, however, the plasma generator 36 has the capture 370 for capturing the droplets, so the amount of droplets captured by the baffles 342 of the guide 34 is small. This significantly reduces the necessity of maintenance of the guide 34.

The plasma generator 36 has the discharge chamber 361 connected to the duct 341 of the guide 34. The plasma generator 36 also includes a target holder 363 for holding the target 362 as a deposition material and applying a negative potential to the target 362, an anode 365 to which a positive potential is applied, and the capture 370 for capturing the droplets from the target 362. The target 362 functions as a cathode. The target 362 has a columnar shape in this embodiment, but may also have a square pillar shape, a cylindrical shape, or a square tube shape. The anode 365 has an opening, and the internal space of the discharge chamber 361 communicates, through this opening, with the internal space of the duct 341 of the guide 34, and with the internal space of the process chamber 321 of the deposition unit 32. The capture 370 is arranged in the opening of the anode 365. The capture 370 also has an opening, and the internal space of the discharge chamber 361 communicates, through this opening, with the internal space of the duct 341 of the guide 34, and with the internal space of the process chamber 321 of the deposition unit 32. The anode 365 is arranged below the target 362, and the capture 370 arranged in the opening of the anode 365 is also arranged below the target 362.

The target holder 363 can be translated and rotated by a driver 368. The driving mechanism 368 supplies a negative potential to the target holder 363 so as to apply the negative potential to the target 362. That is, the driving mechanism 368 applies a negative potential to the target 362 via the target holder 363.

Also, the plasma generator 36 can include a striker 366 and an electromagnet 367. The striker 366 is a member for generating arc discharge between the target 362 and the anode 365. By thus generating arc discharge between the target 362 and the anode 365, the material of the target 362 is ionized, and plasma particles are generated. An arc spot is formed in a position where the striker 366 comes in contact with the target 362. Arc discharge occurs in this position. The electromagnet 367 adjusts the position of the arc spot. The capture 370 can be arranged so as to capture droplets from the arc spot. When the deposition apparatus 30 is used as a ta-C deposition apparatus for forming a protective film made of a ta-C layer on the member 1, the target 362 is made of carbon.

Figure 3:
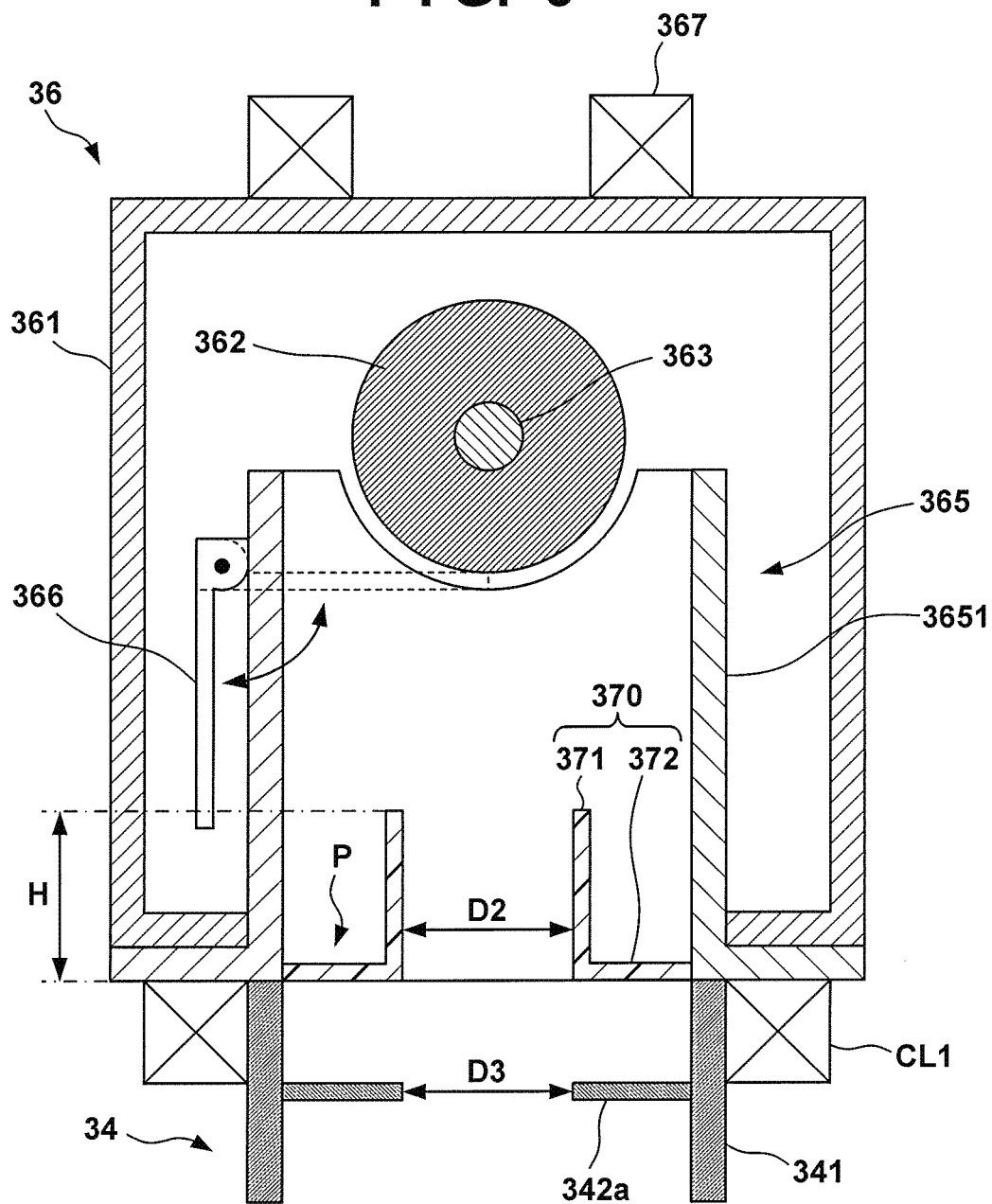
FIG. 3 is a sectional view schematically showing the arrangement of a plasma generator and its periphery of the deposition apparatus.

FIG. 3 shows the section of the plasma generator 36 and its periphery. The anode 365 can include a first cylindrical portion 3651 having a cylindrical shape. This cylindrical shape can include a circular shape, polygonal shape, or star shape, as the shape of a section perpendicular to the axial direction (z-axis direction). The anode 365 can be either electrically insulated from or electrically connected to the discharge chamber 361. The capture 370 can include a second cylindrical portion 371 arranged inside the first cylindrical portion 3651 of the anode 365 so as to let the plasma pass, and a flange portion 372 extending from the second cylindrical portion 371 to the inner wall of the first cylindrical portion 3651. The second cylindrical portion 371 has a cylindrical shape. As an example, the outer edge of the flange portion 372 can directly be connected to a portion such as the lower end portion of the anode 365. As another example, the outer edge of the flange portion 372 can be connected to the anode 365 via another member. The flange portion 371 can have a frame shape or ring shape. The capture 370 is electrically insulated from the anode 365. The capture 370 can be made of a conductive material maintained at a predetermined potential, and can also electrically be floated.

FIG. 3 shows a configuration example in which the anode 365 is arranged in the discharge chamber 361. Instead of this configuration example, however, a configuration in which the whole or a part of the discharge chamber 361 is used as an anode is also useful. That is, the discharge chamber 361 can include an anode portion which functions as an anode, instead of the anode 365. This anode portion has an opening, and the capture 370 can be arranged in this opening.

In the configuration example shown in FIG. 3, a capturing pocket P for capturing droplets is formed by the outer circumferential surface of the second cylindrical portion 371 of the capture 370, the upper surface of the flange portion 372 of the capture 370, and the inner circumferential surface of the first cylindrical portion 3651 of the anode 365. Droplets generated from the arc spot or the like can be captured by the capturing pocket P. By thus arranging the capture 370 in the opening of the anode 365, many droplets are captured in the plasma generator 36, that is, in a position close to the target 362 as a plasma source. This can largely reduce droplets to be captured by the baffles 342 (342*a*) of the guide 34 on the downstream side of the plasma stream. This is advantageous in decreasing the frequency of maintenance of the guide 34. The droplets captured by the capture 370 can be removed from the capture 370 by, for example, exposing the discharge chamber 361 to the atmosphere.

Figure 4:
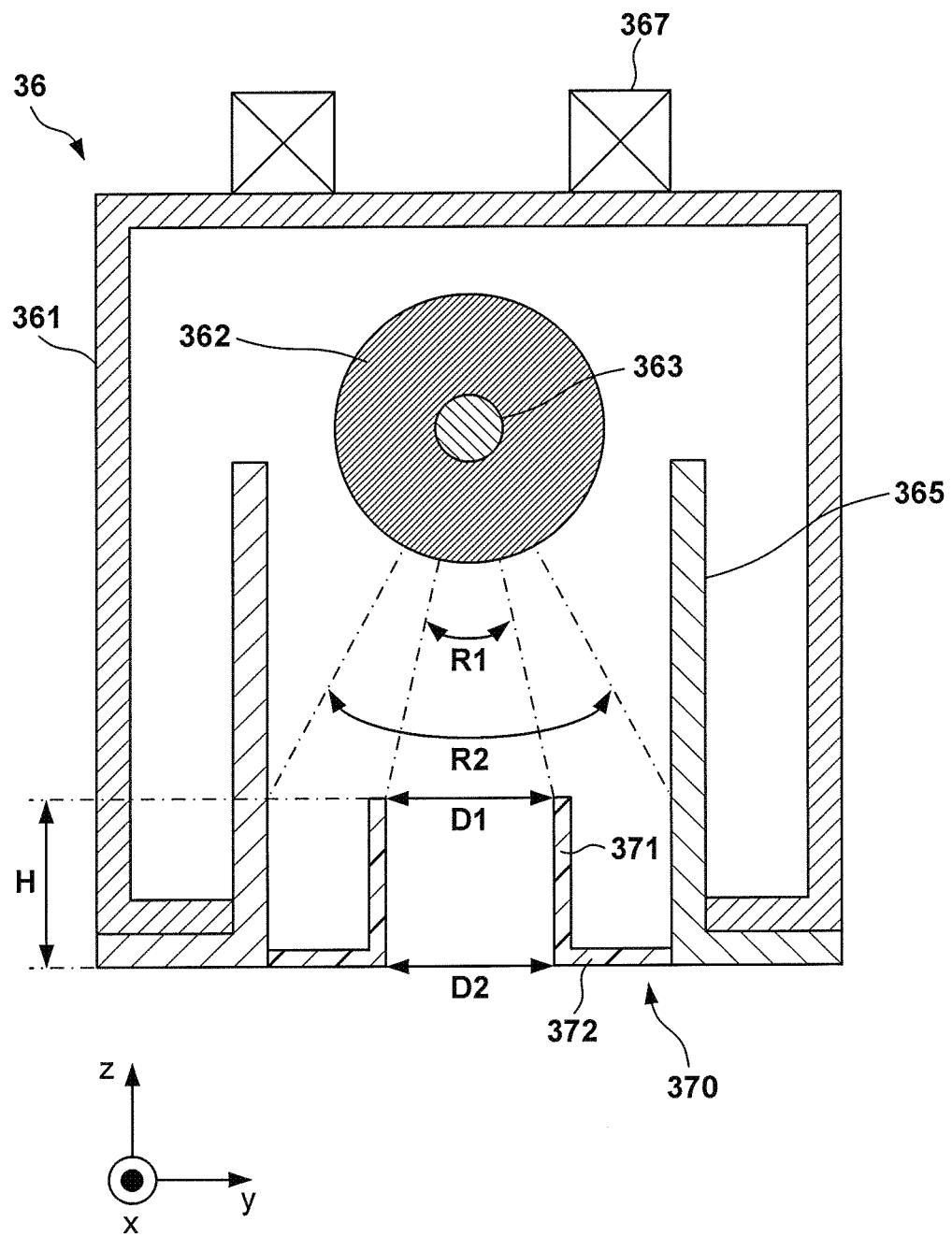
FIG. 4 is a sectional view schematically showing the arrangement of the plasma generator and its periphery of the deposition apparatus.

The spreads of droplets and a plasma will be explained with reference to FIGS. 3 and 4. Droplets are hardly affected by a magnetic field, so droplets generated in the arc spot or the like easily spread in the horizontal direction when traveling in the vertical direction (gravity direction). On the other hand, a plasma is affected by a magnetic field more easily than droplets, and hence hardly spreads in the horizontal direction when traveling in the vertical direction by being guided by a magnetic field generated by the coil CL. That is, in the discharge chamber 361, the plasma and droplets differently spread in the horizontal direction. FIG. 4 shows the spread (distribution) of the plasma by R1, and the spread of the droplets by R2.

Let H be the height of the second cylindrical portion 371 of the capture 370. An opening dimension (inner diameter) D1 of the upper end portion (the height H) of the second cylindrical portion 371 can be made smaller than the spread R2 of the droplets in the horizontal direction at the height H, and can be made equal to or larger than the spread R1 of the plasma in the horizontal direction at the height H. This makes it possible to capture the droplets in the capturing pocket A without disturbing the passage of the plasma. It is also possible to form a magnetic field for suppressing the spread of the plasma near the height H. In this case, it is possible to decrease the opening dimension D1 of the upper end portion of the second cylindrical portion 371, and increase the droplet capturing efficiency.

An opening dimension D2 of the lower end portion (that is, on the side of the guide 34) of the second cylindrical portion 371 of the capture 370 can be the same as or different from the opening dimension D1 of the upper end portion. To increase the capturing efficiency of the first baffle 342*a* without blocking the plasma, the opening dimension D2 of the lower end portion of the second cylindrical portion 371 is preferably the same as an opening dimension (inner diameter) D3 of the first baffle 342*a*. As described previously, the first coil CL1 is formed in the portion of the duct 341 between the capture 370 and the first baffle 342*a*. This can suppress the spread of the plasma in that portion. Accordingly, the formation of the coil CL1 increases the effect obtained by making the opening dimension D2 of the lower end portion of the second cylindrical portion 371 equal to the opening dimension D3 of the first baffle 342*a*.

Figure 5:
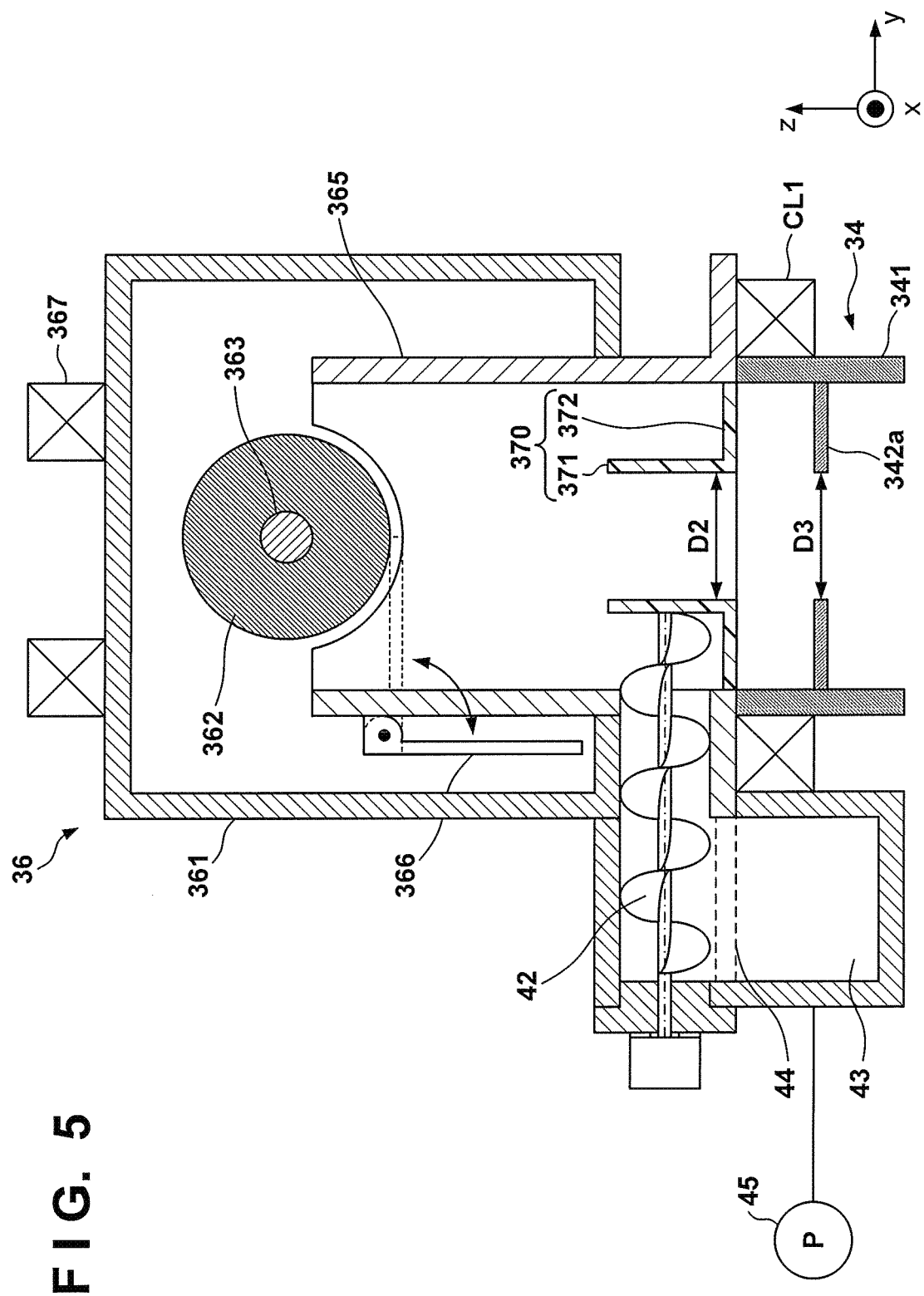
FIG. 5 is a view showing a modification of the deposition apparatus.

FIG. 5 shows a modification of the deposition apparatus 30. Only the differences from the deposition apparatus 30 explained with reference to FIGS. 2 to 4 will be explained below. The deposition apparatus 30 of this modification includes a collection unit 43 for collecting droplets, and a transport unit 42 for transporting droplets captured by the capture 370 to the collection unit 43. The collection unit 43 is a vessel or the like, and can be so configured as to be easily detachable from the deposition apparatus 30 or discharge chamber 361. The transport unit 42 can be any mechanism, for example, a screw conveyor, as long as the mechanism transports droplets from the capture 370 to the collection unit 43.

The collection unit 43 is arranged outside the discharge chamber 361, and a valve 44 can be arranged between the discharge chamber 361 and the collection unit 43. When removing droplets from the collection unit 43, the internal space of the collection unit 43 can be separated from the internal space of the discharge chamber 361 by closing the valve 44. An exhaust mechanism 45 for reducing the pressure of the internal space of the collection unit 43 can be connected to it. In this configuration, droplets can be removed from the collection unit 43 by closing the valve 44 while the deposition apparatus 30 is in operation. After that, the pressure of the internal space of the collection unit 43 is reduced through the exhaust port 45, and the internal spaces of the discharge chamber 361 and collection unit 43 are allowed to communicate with each other by opening the valve 44. In this state, the transport unit 42 can transport droplets from the capture 370 to the collection unit 43.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-001947, filed Jan. 7, 2016, which is hereby incorporated by reference herein in its entirety.

What is claimed is:

1. A deposition apparatus comprising:
a plasma generator configured to generate a plasma by arc discharge; and
a deposition unit configured to form a film on a member by the plasma generated by the plasma generator,
wherein the plasma generator includes:
a discharge chamber having an inner surface;
a target holder configured to hold a target in the discharge chamber and to apply a negative potential to the target;
an anode to which a positive potential is applied, the anode being arranged below the target in the direction of gravity, the anode having an inner surface, and an outer surface facing the inner surface of the discharge chamber; and
a capture electrically insulated from the anode and configured to capture droplets from the target, the capture having an outer surface facing the inner surface of the anode, and
the anode has an opening, and the capture is arranged in the opening.

2. The deposition apparatus according to claim 1, wherein the anode has a first cylindrical portion, and the capture includes a second cylindrical portion arranged inside the first cylindrical portion to let the plasma pass, and a flange portion extending from the second cylindrical portion to an inner wall of the first cylindrical portion.

3. The deposition apparatus according to claim 1, further comprising a guide configured to guide the plasma from the plasma generator to the deposition unit,
wherein the guide includes a bent duct, and a plurality of baffles arranged inside the duct to capture droplets, and an opening dimension of a first baffle closest to the plasma generator among the plurality of baffles is equal to an opening dimension of the capture on a side of the guide.

4. The deposition apparatus according to claim 2, further comprising a guide configured to guide the plasma from the plasma generator to the deposition unit,
wherein the guide includes a bent duct, and a plurality of baffles arranged inside the duct to capture droplets, and an opening dimension of a first baffle closest to the plasma generator among the plurality of baffles is equal to an opening dimension of the second cylindrical portion on a side of the guide.

5. The deposition apparatus according to claim 3, wherein the guide includes a plurality of coils configured to generate a magnetic field for guiding the plasma, and the plurality of coils include a first coil formed in a portion of the duct between the capture and the first baffle.

6. The deposition apparatus according to claim 1, wherein the deposition unit is arranged in a position lower than the plasma generator.

7. The deposition apparatus according to claim 1, wherein the capture includes a cylindrical portion having an outer surface, and a flange portion extending from the cylindrical portion to the inner surface of the anode.

8. The deposition apparatus according to claim 1, wherein the capture includes a tubular portion having an outer surface, and a flange portion extending from the tubular portion to the inner surface of the anode.

9. The deposition apparatus according to claim 1, further comprising a guide configured to guide the plasma from the plasma generator to the deposition unit, the guide including a plurality of coils configured to generate a magnetic field for guiding the plasma, and
the capture is arranged between the target holder and a coil closest to the plasma generator among the plurality of coils.

10. The deposition apparatus according to claim 1, further comprising a guide configured to guide the plasma from the plasma generator to the deposition unit, the guide including a duct, and a plurality of baffles arranged inside the duct to capture droplets, and
the capture is arranged between the target holder and a baffle closest to the plasma generator among the plurality of baffles.

11. The deposition apparatus according to claim 1, wherein the outer surface of the capture faces the inner surface of the discharge chamber via the anode.

12. The deposition apparatus according to claim 1, wherein the target has a columnar shape, and a cylindrical side surface of the target faces the capture.

13. The deposition apparatus according to claim 1, further comprising:
a striker arranged in the discharge chamber and configured to generate arc discharge between the target and the anode; and
an electromagnet arranged outside the discharge chamber and configured to adjust a position of an arc spot formed at a position of the target, where the striker comes in contact with the target.

14. The deposition apparatus according to claim 13, wherein the target holder is configured to hold the target at a position between the capture and the electromagnet.

15. The deposition apparatus according to claim 1, wherein a space between the outer surface of the anode and the inter surface of the discharge chamber communicates with a space surrounded by the inner surface of the anode.

16. A deposition apparatus comprising:
a plasma generator configured to generate a plasma by arc discharge, the plasma generator including a target holder configured to hold a target and apply a negative potential to the target, an anode to which a positive potential is applied, and a capture configured to capture droplets from the target, wherein the anode has an opening, and the capture is arranged in the opening;
a deposition unit configured to form a film on a member by the plasma generated by the plasma generator;
a collection unit configured to collect droplets; and
a transport unit configured to transport droplets captured by the capture to the collection unit.

17. The deposition apparatus according to claim 16, wherein the plasma generator includes a discharge chamber, the target holder, the anode, and the capture are arranged in the discharge chamber, the collection unit is arranged outside the discharge chamber, and a valve is arranged between the discharge chamber and the collection unit.

\* \* \* \* \*